United States Patent
Jung et al.

(10) Patent No.: US 9,330,766 B1
(45) Date of Patent: May 3, 2016

(54) SEMICONDUCTOR DEVICE AND OPERATING METHOD THEREOF

(71) Applicant: SK hynix Inc., Gyeonggi-do (KR)

(72) Inventors: Sung Wook Jung, Gyeonggi-do (KR); Hye Eun Heo, Gyeonggi-do (KR); Ji Hui Baek, Gyeonggi-do (KR); Dong Hun Lee, Gyeonggi-do (KR); Tae Hwa Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/816,929

(22) Filed: Aug. 3, 2015

(30) Foreign Application Priority Data

Mar. 9, 2015 (KR) .......................... 10-2015-0032461

(51) Int. Cl.
*G11C 16/08* (2006.01)
*G11C 16/10* (2006.01)
*G11C 16/04* (2006.01)

(52) U.S. Cl.
CPC ............ *G11C 16/08* (2013.01); *G11C 16/0483* (2013.01); *G11C 16/10* (2013.01)

(58) Field of Classification Search
CPC ..... G11C 16/10; G11C 16/08; G11C 16/0483
See application file for complete search history.

(56) References Cited

U.S. PATENT DOCUMENTS

2006/0071265 A1*  4/2006  Koh ................... G11C 16/0433
                                                               257/315

FOREIGN PATENT DOCUMENTS

KR   1020100113768   10/2010
KR   1020140028565   3/2014

* cited by examiner

*Primary Examiner* — Richard Elms
*Assistant Examiner* — Ajay Ojha
(74) *Attorney, Agent, or Firm* — IP & T Group LLP

(57) ABSTRACT

A semiconductor device according to an embodiment may include cell strings including a plurality of memory cells coupled between bit lines and a source line and coupled to word lines, a peripheral circuit suitable for programming selected memory cells coupled to a selected word line among the word lines by applying a program voltage to the selected word line, and applying one or more pass voltages to unselected word lines, and a control circuit suitable for controlling the peripheral circuit to temporarily float the unselected word lines while the selected memory cells are programmed.

16 Claims, 7 Drawing Sheets

SEMICONDUCTOR DEVICE AND OPERATING METHOD THEREOF

CROSS-REFERENCE TO RELATED APPLICATION

The present application claims priority to Korean patent application number 10-2015-0032461, filed on Mar. 9, 2015, the entire disclosure of which is herein incorporated by reference in its entirety.

BACKGROUND

1. Field of Invention

Various exemplary embodiments relate generally to a semiconductor device and an operating method thereof, and more particularly, to a program method.

2. Description of Related Art

Semiconductor memory devices have a memory cell array for storing data and peripheral circuits configured to perform program operations, read operations and erase operations, and a control circuit for controlling the peripheral circuits. Memory cell arrays include memory blocks that have substantially the same structure. Each of the memory blocks includes a plurality of cell strings. When a program operation is performed, specific cell strings and memory blocks are selected.

During a program operation, a program permission voltage is applied to channels of the selected cell strings, and a program inhibition voltage is applied to channels of unselected cell strings. For example, the program permission voltage may be 0V, and the program inhibition voltage may be a power voltage VCC.

Unselected memory cells of the unselected cell strings are more effectively prevented from being programmed when the difference between a channel voltage and a program voltage is small. To reduce the voltage difference between the channel voltage and the program voltage, channel voltages of the unselected cell strings are increased through channel boosting.

Channel boosting is an increase in the channel voltage due to coupling between a pass voltage applied to unselected word lines and the program inhibition voltage applied to the channel. However, due to the characteristics of a semiconductor device, channel boosting may be reduced while a program operation is performed. When channel boosting is reduced, the channel voltage of the unselected cell strings may be reduced, and unselected memory cells may be unintentionally programmed.

SUMMARY

Various embodiments are directed to a semiconductor device capable preventing a reduction of channel boosting of unselected cells strings, and an operating method thereof.

According to an embodiment, a semiconductor device may include cell strings including a plurality of memory cells coupled between bit lines and a source line and coupled to word lines, a peripheral circuit suitable for programming selected memory cells coupled to a selected word line among the word lines by applying a program voltage to the selected word line, and applying one or more pass voltages to unselected word lines, and a control circuit suitable for controlling the peripheral circuit to temporarily float the unselected word lines while the selected memory cells are programmed.

A method of operating a semiconductor device according to an embodiment may include performing a program operation on selected memory cells, and temporarily floating unselected word lines coupled to unselected memory cells while the program operation is performed.

A method of operating a semiconductor device according to an embodiment may include applying a program permission voltage to selected bit lines and applying a program inhibition voltage to unselected bit lines, applying a first pass voltage to a selected word line and unselected word lines, applying a program voltage to the selected word line after the first pass voltage is applied for a predetermined period of time, and temporarily floating the unselected word lines to which the first pass voltage is applied while the program voltage is applied to the selected word line.

DETAILED DESCRIPTION

Hereinafter, various embodiments will be described in detail with reference to the accompanying drawings. The figures are provided to allow those with ordinary skill in the art to understand the scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art.

Figure 1:
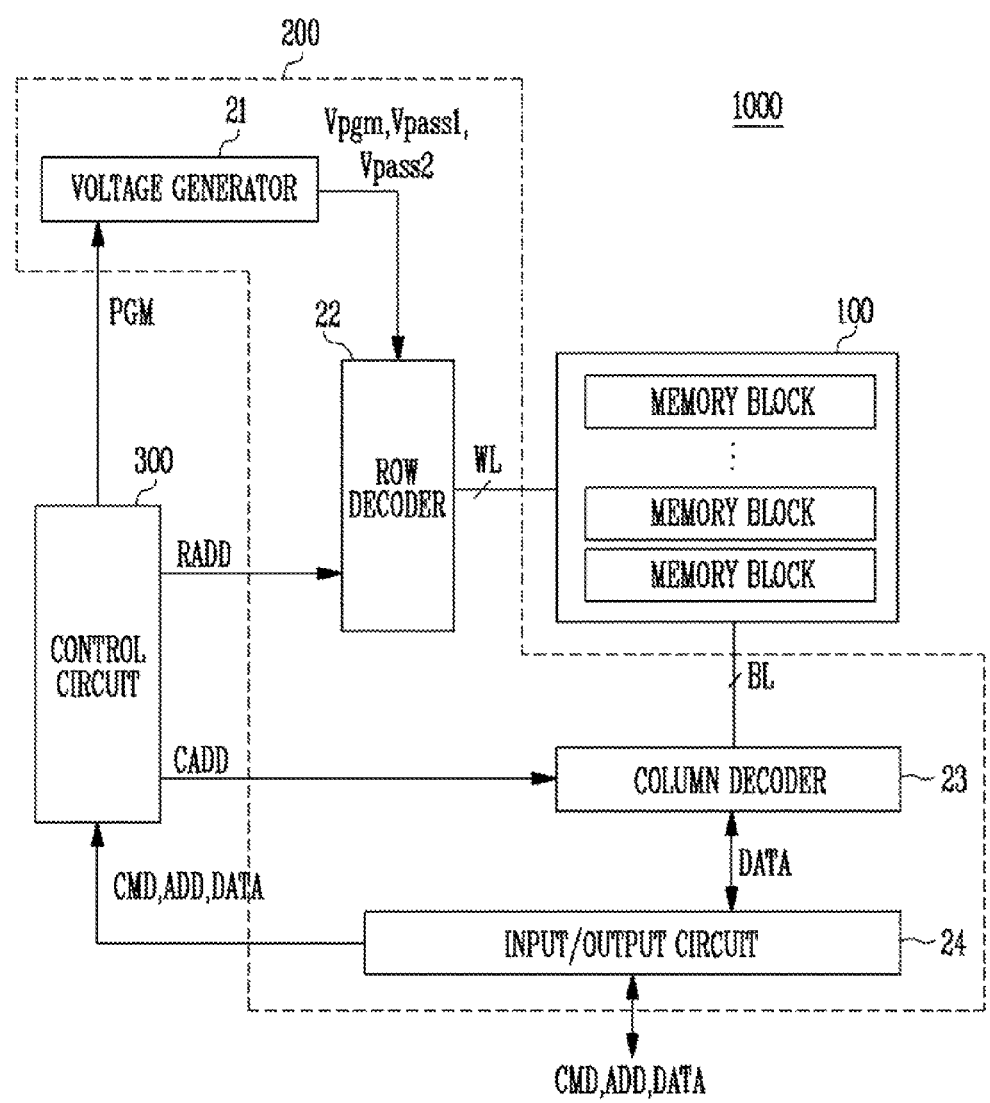
FIG. 1 is a view illustrating a semiconductor device according to an embodiment.

FIG. 1 is a diagram illustrating a semiconductor device according to an embodiment.

Referring to FIG. 1, a semiconductor device 1000 may include a memory cell array 100 configured to store data, a peripheral circuit 200 configured to perform program, read and erase operations on the memory cell array 100, and a control circuit 300 configured to control the peripheral circuit 200.

The memory cell array 100 may include a plurality of memory blocks. The memory blocks may be configured in similar manner and include a plurality of cell strings having a two-dimensional or three-dimensional structure.

The peripheral circuit 200 may include a voltage generator 21, a row decoder 22, a column decoder 23 and an input/output circuit 24.

The voltage generator 21 may generate voltages of various levels in response to an operation signal. When the voltage generator 21 receives a program operation signal PGM, the voltage generator 21 may generate a program voltage Vpgm, a first pass voltage Vpass1 and a second pass voltage Vpass2 necessary to perform a program operation. The program voltage Vpgm may be applied to a selected word line to increase a threshold voltage of a selected memory cell. The first and second pass voltages Vpass1 and Vpass22 may be applied to unselected word lines. During the program operation, the second pass voltage Vpass2 which is higher than the first pass voltage Vpass1 applied to the unselected word lines may be used to increase channel boosting of unselected cell strings. The voltage generator 21 may generate various other voltages necessary to perform a read operation and an erase operation in addition to the above-described voltages. In addition, during the program operation, the voltage generator 21 may temporarily float the word lines to which the pass voltage is applied in response to control of the control circuit 300.

The row decoder 22 may select one of the plurality of memory blocks in response to a row address RADD and transfer the voltages generated by the voltage generator 21 to word lines coupled to the selected memory block.

The column decoder 23 may exchange data through bit lines BL in response to a column address CADD. During the program operation, the column decoder 23 may apply a program permission voltage to selected bit lines and a program inhibition voltage to unselected bit lines in response to control of the control circuit 300. The program permission voltage may be a ground voltage, and the program inhibition voltage may be a power voltage.

The input/output circuit 24 may receive a command signal CMD, an address ADD and data DATA, and transfer the command signal CMD and the address ADD to the control circuit 300. The input/output circuit 24 may exchange the data DATA with the control circuit 300 or the column decoder 23. The input/output circuit 24 may exchange the data DATA with an external device.

The control circuit 300 may output the program operation signal PGM, the row address RADD and the column address CADD to control the peripheral circuit 200 in response to the command signal CMD and the address ADD. In accordance with an exemplarily embodiment of the present invention, during the program operation, in order to prevent channel boosting of the unselected cell strings from being reduced, the control circuit 300 may control the peripheral circuit 200 to temporarily float the unselected word lines once or more while the program voltage Vpgm is applied to the selected word line and the first pass voltage Vpass is applied to the unselected word lines.

Figure 2:
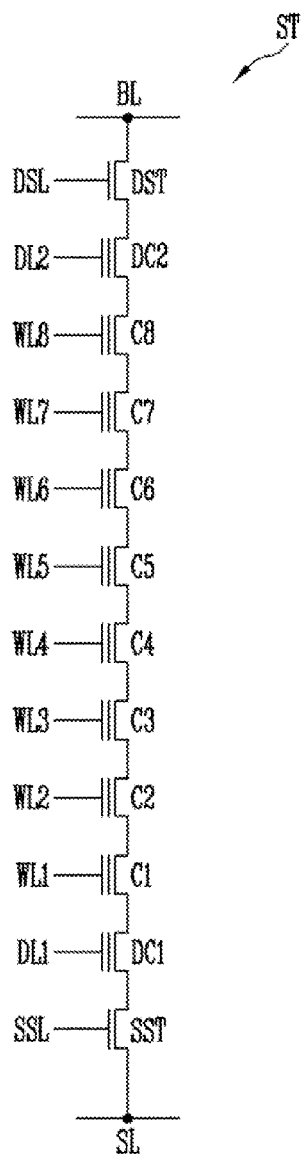
FIGS. 2 and 3 are views illustrating cell strings according to various embodiments.
Figure 3:
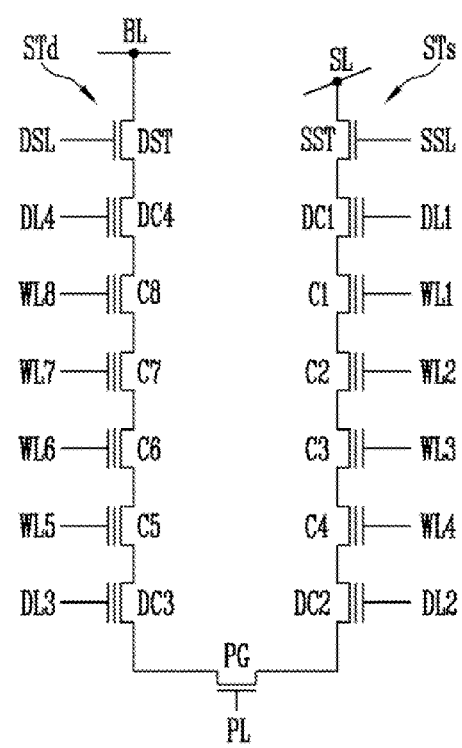

FIGS. 2 and 3 are diagrams illustrating cell strings according to various embodiments. In FIGS. 2 and 3, circuits of three-dimensional cell strings are shown.

Referring to FIG. 2, a cell string ST according to an embodiment may be formed in an "I" shape over a substrate. For example, in the cell string ST, a source line SL may be formed on the substrate, the bit line BL may be formed over the source line SL, and a source selection transistor SST, memory cells C1 to C8 and a drain selection transistor DST may be formed between the source line SL and the bit line BL. A gate of the source selection transistor SST may be coupled to a source selection line SSL, gates of the memory cells C1 to C8 may be coupled to word lines WL1 to WL8, respectively, and a gate of the drain selection transistor DST may be coupled to a drain selection line DSL. In addition, a first dummy cell DC1 may be coupled between the source selection transistor SST and the first memory cell C1, and a second dummy cell DC2 may be coupled between the eighth memory cell C8 and the drain selection transistor DST. A gate of the first dummy cell DC1 may be coupled to a first dummy line DL1, and a gate of the second dummy cell DC2 may be coupled to a second dummy line DL2. A channel of each of the unselected cell strings ST, among the cell strings included in the selected memory block, may be coupled between the source selection transistor SST and the drain selection transistor DST. Channel boosting may occur when the source and drain selection transistors SST and DST are turned off and the pass voltage is applied to the unselected word lines.

Referring to FIG. 3, a cell string according to another embodiment may be formed in a "U" shape over the substrate. For example, the cell string may include a pipe transistor PG formed over the substrate, and a first sub-string STs and a second sub-string STd formed at both ends of the pipe transistor PG. The first sub-string STs and the second sub-string STd may be coupled by the pipe transistor PG. The first sub-string STs may include the source selection transistor SST and the memory cells C1 to C4 which are coupled in series between the source line SL and the pipe transistor PG. The second sub-string STd may include the memory cells C5 to C8 and the drain selection transistor DST which are coupled in series between the pipe transistor PG and the bit line BL. The gate of the source selection transistor SST may be coupled to the source selection line SSL, and the gates of the memory cells C1 to C4 may be coupled to the word lines WL1 to WL4, respectively. The gates of the memory cells C5 to C8 may be coupled to the word lines WL5 to WL8, the gate of the drain selection transistor DST may be coupled to the gate of the drain selection line DSL, and the gate of the pipe transistor PG may be coupled to a pipe line PL.

In addition, the first dummy cell DC1 may be coupled between the source selection transistor SST and the first memory cell C1, the second dummy cell DC2 may be coupled between the fourth memory cell C4 and the pipe transistor PG, the third dummy cell DC3 may be coupled between the pipe transistor PG and the fifth memory cell C5, and the fourth dummy cell DC4 may be coupled between the eighth memory cell C8 and the drain selection transistor DST. The gates of the first to fourth dummy cells DC1 to DC4 may be coupled to first to fourth dummy lines DL1 to DL4, respectively. In each of the unselected cell strings ST, among the cell strings included in the selected memory block, a channel may be formed between the source selection transistor SST and the pipe transistor PG and between the pipe transistor PG and the drain selection transistor DST. Channel boosting may occur when the source and drain selection transistors SST and DST are turned off and the pass voltage is applied to the unselected word lines.

A program operation of the above-described semiconductor device 1000 is described below.

Figure 4:
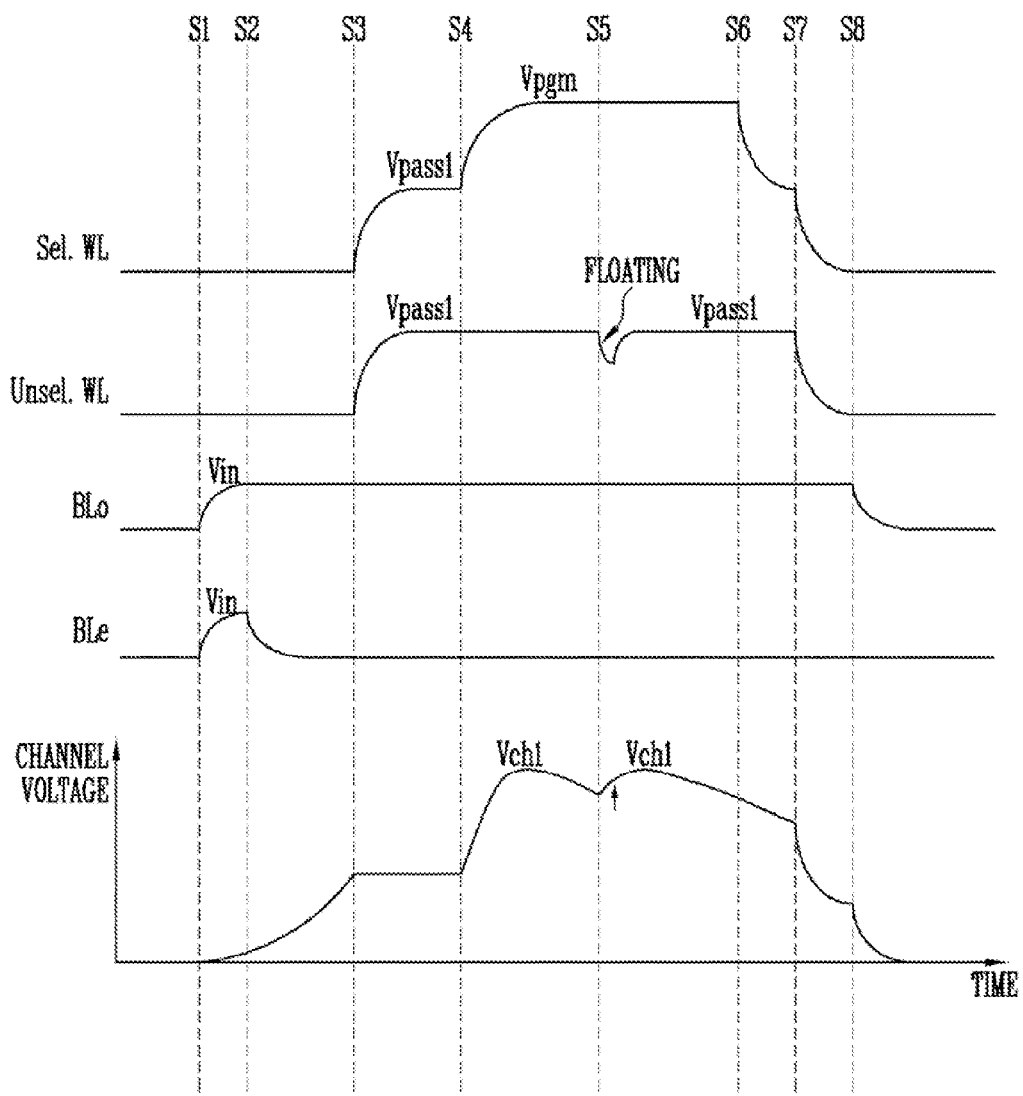
FIG. 4 is a timing diagram illustrating a program operation according to an embodiment.

FIG. 4 is a timing diagram illustrating the program operation according to an embodiment.

Referring to FIG. 4, the program operation may be performed by using an incremental step pulse program (ISPP) method in which a program voltage is gradually increased, or by applying the program voltage once to a selected word line.

This embodiment is applicable to various types of program operations, especially where the program voltage is applied to the selected word line.

According to this embodiment, during the program operation, a reduction of a channel voltage may be prevented by temporarily floating unselected word lines Unsel. WL. The unselected word lines Unsel. WL may be temporarily floated while the first pass voltage Vpass1 is applied to the unselected word lines Unsel. WL. A detailed description thereof is as follows.

Bit Line Setup Stage (S1 to S3)

At a time point S1 when a bit line setup stage starts, a program inhibition voltage Vin may be applied to bit lines BLe and BLo. At a time point S2, a potential of the selected bit lines BLe coupled to a selected cell string may be reduced to a program permission voltage level, and the program inhibition voltage Vin may be continuously applied to the unselected bit lines BLo. At the time point S1, a channel voltage of unselected cell strings may start to increase by the program inhibition voltage Vin applied to the unselected bit lines BLo.

Program Operation (S3 to S7)

When the bit line setup stage is completed, the first pass voltage Vpass1 may be applied to all word lines Sel. WL and Unsel. WL at a time point S3. When the first pass voltage Vpass1 is applied to the word lines Sel. WL and Unsel. WL, the channel voltage of the unselected cell strings among the cell strings included in the selected memory block may be maintained at a predetermined level by the program inhibition voltage Vin applied to the unselected bit lines BLo, and a channel voltage of selected cell strings may be maintained at 0V by the program permission voltage (e.g., ground voltage) applied to the selected bit lines BLe. At a time point S4 when channels are stably formed in the cell strings, the program voltage Vpgm may be applied to the selected word line Sel. WL so that memory cells of the selected cell strings may be programmed. The channel voltage of the unselected cell strings may be increased by the first pass voltage Vpass1 so that the source and drain selection transistors SST and DSL of the unselected cell strings may be turned off. When the source and drain selection transistors SST and DSL are turned off, channel boosting may occur by coupling between the first pass voltage Vpass1 and the channel voltage. Therefore, the channel voltages of the unselected cell strings may increase to the first channel voltage Vch1. The first channel voltage Vch1 may prevent the memory cells in the unselected cell strings from being programmed even when the program voltage Vpgm is applied to the selected word line Sel. WL.

During the program operation, although the channel voltages of the unselected cell strings are to remain constant at the first channel voltage Vch1, the channel voltages of the unselected cell strings may be reduced for various reasons such as to reduce leakage current. When the channel voltages of the unselected cell strings are reduced, unselected memory cells included in the unselected cell strings may be programmed. Therefore, to prevent the unselected memory cells from being programmed, the unselected word lines Unsel. WL may be temporarily floated.

More specifically, the unselected word lines Unsel. WL may be temporarily floated within a time interval from S4 to S6 (e.g., S5) when the program voltage Vpgm is applied to the selected word line Sel. WL. When the unselected word lines Unsel. WL are temporarily floated, coupling between the unselected word lines Unsel. WL and the channel in the floating state may be increased and thus the channel voltages of the unselected cell strings may increase to the first channel voltage Vch1 again.

After the unselected word lines Unsel. WL are temporarily floated, the first pass voltage Vpass1 may be applied to the unselected word lines Unsel. WL again. In other words, when the unselected word lines Unsel. WL are maintained in the floating state, the channel voltage of the unselected cell strings may keep increasing. Thus, the unselected memory cells may be erased. In order to prevent the unselected memory cells from being erased, after the unselected word lines Unsel. WL are floated, the first pass voltage Vpass1 may be applied to the unselected word lines Unsel. WL again.

When the program voltage Vpgm is applied to the selected word line Sel. WL (at a time point S6), the program voltage Vpgm may be reduced. Lines or memory cells adjacent to the selected word line Sel. WL may be affected when the program voltage Vpgm applied to the selected word line Sel. WL is rapidly reduced. Therefore, the program voltage Vpgm may be gradually reduced. For example, a potential of the selected word line Sel. WL may be reduced to the first pass voltage Vpass1.

Program Termination Stage (S7 and S8)

At a time point S7 when the program operation terminates, the potentials of all word lines Sel. WL and Unsel. WL may be reduced to 0V. At a time point S8, the potential of the unselected bit lines BLo may be reduced to 0V to thereby reduce the channel voltage.

As described above, during the program operation, the channel voltage of the unselected cell strings may be gradually reduced from the first channel voltage Vch1. However, by temporarily floating the unselected word lines Unsel. WL, the decreased channel voltages of the unselected cell strings may be recovered to the first channel voltage Vch1. Therefore, the memory cells included in the unselected cell strings may be prevented from being programmed.

Figure 5:
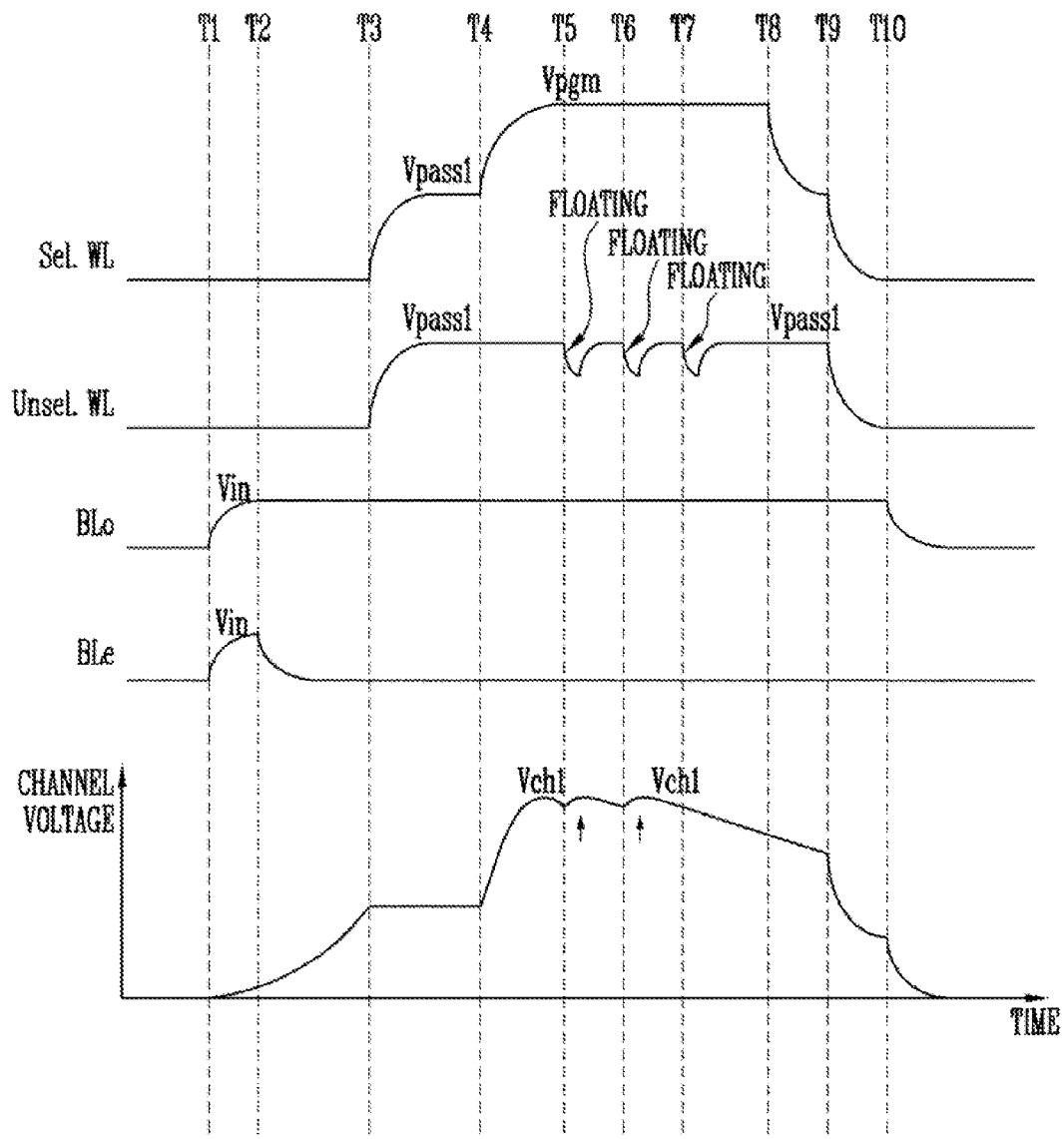
FIG. 5 is a timing diagram illustrating a program operation according to another embodiment.

FIG. 5 is a timing diagram illustrating a program operation according to another embodiment.

Referring to FIG. 5, the program operation may be performed by using an incremental step pulse program (ISPP) method in which a program voltage is gradually increased, or by applying the program voltage once to a selected word line. This embodiment is applicable to various types of program operations, especially where the program voltage is applied to the selected word line.

According to this embodiment, during the program operation, the unselected word lines Unsel. WL may be temporarily floated several times, so that a reduction of a channel voltage may be prevented. The unselected word lines Unsel. WL may be temporarily floated while the first pass voltage Vpass1 is applied to the unselected word lines Unsel. WL. A detailed description thereof is described below.

Bit Line Setup Stage (T1 to T3)

At a time point T1 when a bit line setup stage starts, the program inhibition voltage Vin may be applied to the bit lines BLe and BLo. At a time point T2, a potential of the selected bit lines BLe coupled to a selected cell string may be reduced to a program permission voltage level, and the program inhibition voltage Vin may be continuously applied to the unselected bit lines BLo. From the time point T1, a channel voltage of unselected cell strings may start to increase by the program inhibition voltage Vin applied to the unselected bit lines BLo.

Program Operation (T3 to T9)

When the bit line setup stage is completed, the first pass voltage Vpass1 may be applied to all word lines Sel. WL and Unsel. WL at a time point T3. When the first pass voltage Vpass1 is applied to the word lines Sel. WL and Unsel. WL, the channel voltage of the unselected cell strings, among the cell strings included in the selected memory block, may be maintained at a predetermined level by the program inhibition voltage Vin applied to the unselected bit lines BLo, and a channel voltage of selected cell strings may be maintained at 0V by a program permission voltage (e.g., ground voltage) applied to the selected bit lines BLe. At a time point T4 when channels are stably formed in the cell strings, the program voltage Vpgm may be applied to the selected word line Sel. WL, and memory cells included in the selected cell strings may be programmed. The first pass voltage Vpass1 may cause the channel voltage of the unselected cell strings to be increased, so that the source and drain selection transistors SST and DSL included in the unselected cell strings may be turned off. When the source and drain selection transistors SST and DSL are turned off, channel boosting may occur by coupling between the first pass voltage Vpass1 and the channel voltage. Therefore, channel voltages of the unselected cell strings may be increased to the first channel voltage Vch1. The first channel voltage Vch1 may prevent memory cells included in the unselected cell strings from being programmed even when the program voltage Vpgm is applied to the selected word line Sel. WL.

During the program operation, although the channel voltages of the unselected cell strings are to remain constant at the first channel voltage Vch1, the channel voltages of the unselected cell strings may be reduced for various reasons, such as to reduce leakage current. When the first channel voltages of the unselected cell strings are reduced, the unselected memory cells included in the unselected cell strings may be programmed. Therefore, to prevent the unselected cell strings from being programmed, according to an embodiment, the unselected word lines Unsel. WL may be temporarily floated.

More specifically, the unselected word lines Unsel. WL may be temporarily floated at predetermined time points (e.g., T5, T6 and T7) within a time interval from T4 to T9 when the program voltage Vpgm is applied to the selected word line Sel. WL. The time points T5, T6 and T7 are merely an example, and the unselected word lines Unsel. WL may be temporarily floated at more than three time points. When the unselected word lines Unsel. WL are temporarily floated, coupling between the unselected word lines Unsel. WL and the channel having a floating state may be increased and thus the channel voltages of the unselected cell strings may increase to the first channel voltage Vch1 again.

After the unselected word lines Unsel. WL are temporarily floated, the first pass voltage Vpass1 may be applied to the unselected word lines Unsel. WL again. In other words, when the unselected word lines Unsel. WL are maintained in the floating state, the channel voltage of the unselected cell strings may keep increasing by coupling between the unselected word lines Unsel. WL and the channel. Thus, the unselected memory cells may be erased. To prevent the unselected memory cells from being erased, after the unselected word lines Unsel. WL are floated, the first pass voltage Vpass1 may be applied to the unselected word lines Unsel. WL again.

When the program voltage Vpgm is applied to the selected word line Sel. WL again (at a time point S6), the program voltage Vpgm may be reduced for a predetermined period of time. However, when the program voltage Vpgm applied to the selected word line Sel. WL is rapidly reduced, the lines or the memory cells around the selected word line Sel. WL may be affected. Therefore, the program voltage Vpgm may be gradually reduced. For example, a potential of the selected word line Sel. WL may be reduced to the first pass voltage Vpass1.

Program Termination Stage (T9 and T10)

At a time T9 when the program operation is terminated, the potentials of all word lines Sel. WL and Unsel. WL may be reduced to 0V. At a time point T10, the potential of the unselected bit lines BLo may be reduced to 0V to reduce the channel voltage.

As described above, during the program operation, the channel voltage of the unselected cell strings may be gradually reduced from the first channel voltage Vch1. However, by temporarily floating the unselected word lines Unsel. WL several times, the decreased channel voltages of the unselected cell strings may be recovered to the first channel voltage Vch1. Therefore, the memory cells included in the unselected cell strings may be prevented from being programmed.

Figure 6:
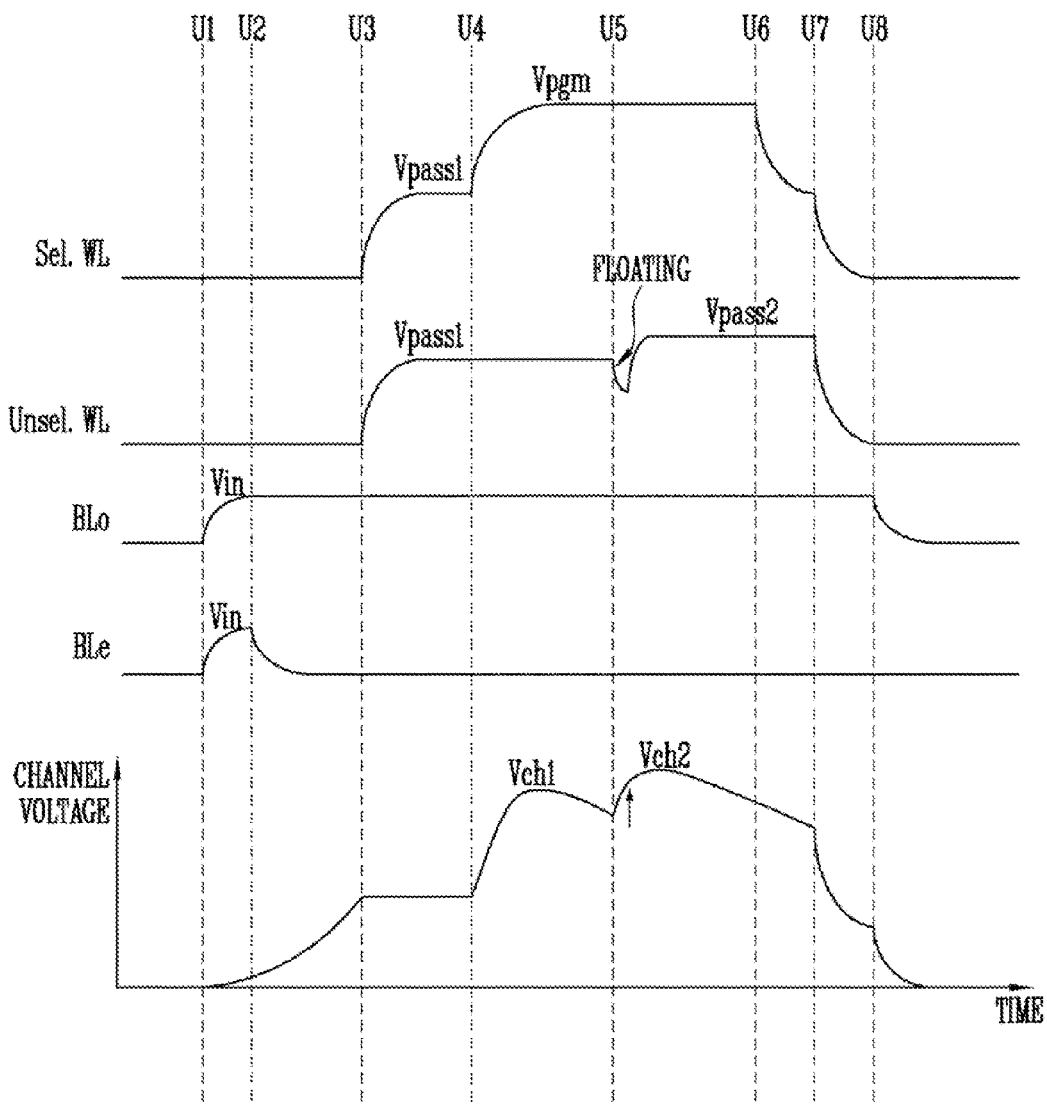
FIG. 6 is a timing diagram illustrating a program operation according to another embodiment.

FIG. 6 is a timing diagram illustrating a program operation according to another embodiment.

Referring to FIG. 6, the program operation may be performed by using an incremental step pulse program (ISPP) method in which a program voltage is gradually increased, or by applying the program voltage once to a selected word line. This embodiment is applicable to various types of program operations, especially where the program voltage is applied to a selected word line.

According to this embodiment, during the program operation, a reduction of a channel voltage may be prevented by temporarily floating the unselected word lines Unsel. WL several times. The unselected word lines Unsel. WL may be temporarily floated several times while various pass voltages are applied to the unselected word lines Unsel. WL. A detailed description thereof is as follows.

Bit Line Setup Stage (U1 to U3)

At a time point U1 when a bit line setup stage starts, the program inhibition voltage Vin may be applied to the bit lines BLe and BLo. At a time point U2, a potential of the selected bit lines BLe coupled to a selected cell string may be reduced to a program permission voltage level, and the program inhibition voltage Vin may be continuously applied to the unselected bit lines BLo. From the time point U1, a channel voltage of unselected cell strings may start to increase by the program inhibition voltage Vin applied to the unselected bit lines BLo.

Program Stage (U3 to U7)

When the bit line setup stage is completed, the first pass voltage Vpass1 may be applied to all word lines Sel. WL and Unsel. WL at a time point U3. When the first pass voltage Vpass1 is applied to the word lines Sel. WL and Unsel. WL, the channel voltage of the unselected cell strings, among the cell strings included in the selected memory block, may be maintained at a predetermined level by the program inhibition voltage Vin applied to the unselected bit lines BLo, and a channel voltage of selected cell strings may be maintained at 0V by a program permission voltage (e.g., ground voltage) applied to the selected bit lines BLe.

At a time point U4 when channels are stably formed in the cell strings, the program voltage Vpgm may be applied to the selected word line Sel. WL, so that memory cells included in the selected cell strings may be programmed. The channel voltage of the unselected cell strings may be increased by the first pass voltage Vpass1, so that the source and drain selection transistors SST and DSL included in the unselected cell strings may be turned off. When the source and drain selection transistors SST and DSL are turned off, channel boosting may occur by coupling between the first pass voltage Vpass1 and the channel voltage. Therefore, the channel voltages of the unselected cell strings may increase to the first channel voltage Vch1. The first channel voltage Vch1 may prevent memory cells included in the unselected cell strings from being programmed even when the program voltage Vpgm is applied to the selected word line Sel. WL.

During the program operation, although the channel voltages of the unselected cell strings are to remain constant or higher than the first channel voltage Vch1, the channel voltages of the unselected cell strings may be reduced for various reasons such as to reduce leakage current. When the channel voltages of the unselected cell strings are reduced, unselected memory cells included in the unselected cell strings may be programmed. Therefore, to prevent the unselected memory cells from being programmed, the unselected word lines Unsel. WL may be floated.

More specifically, the unselected word lines Unsel. WL may be temporarily floated at a predetermined time point (e.g., time point U5) within a time interval from U4 to U6 when the program voltage Vpgm is applied to the selected word line Sel. WL. When the unselected word lines Unsel. WL are temporarily floated, coupling between the unselected word lines Unsel. WL and the channel in a floating state may be increased and thus the channel voltages of the unselected cell strings may increase again.

After the unselected word lines Unsel. WL are temporarily floated, the second pass voltage Vpass2, which is higher than the first pass voltage Vpass1 and lower than the program voltage Vpgm, may be applied to the unselected word lines Unsel. WL. When the unselected word lines Unsel. WL are maintained in the floating state, the channel voltage of the unselected cell strings may keep increasing. Thus, the unselected memory cells may be erased. Therefore, to prevent the unselected memory cells from being erased, the pass voltage may be applied to the unselected word lines Unsel. WL again after the unselected word lines Unsel. WL are floated. The second pass voltage Vpass2 which is higher than the first pass voltage Vpass may be applied to the unselected word lines Unsel. WL, considering that the voltage will decrease again while the program operation is performed. When the second pass voltage Vpass2 is applied to the unselected word lines Unsel. WL, the potential of the channel may increase to a second channel voltage Vch2.

When the program voltage Vpgm is applied to the selected word line Sel. WL for a predetermined period of time (at a time point U6), the program voltage Vpgm may be reduced. However, lines or memory cells around the selected word line Sel. WL may be affected when the program voltage Vpgm applied to the selected word line Sel. WL is reduced rapidly. Therefore, the program voltage Vpgm may be gradually reduced. For example, a potential of the selected word line Sel. WL may be reduced to the first pass voltage Vpass1.

Program Termination Stage (U7 and U8)

At a time point U7 when the program operation terminates, the potentials of all word lines Sel. WL and Unsel. WL may be reduced to 0V. At a time point U8, the potential of the unselected bit lines BLo may be reduced, so that the potential of the channel may be reduced.

As described above, although the channel voltage of the unselected cell strings may be gradually reduced from the first channel voltage Vch1 during the program operation, the decreased channel voltages of the unselected cell strings may be recovered to be constant or higher than the first channel voltage Vch1 by temporarily floating the unselected word lines Unsel. WL and applying various pass voltages. Therefore, the memory cells included in the unselected cell strings may be prevented from being programmed.

Figure 7:
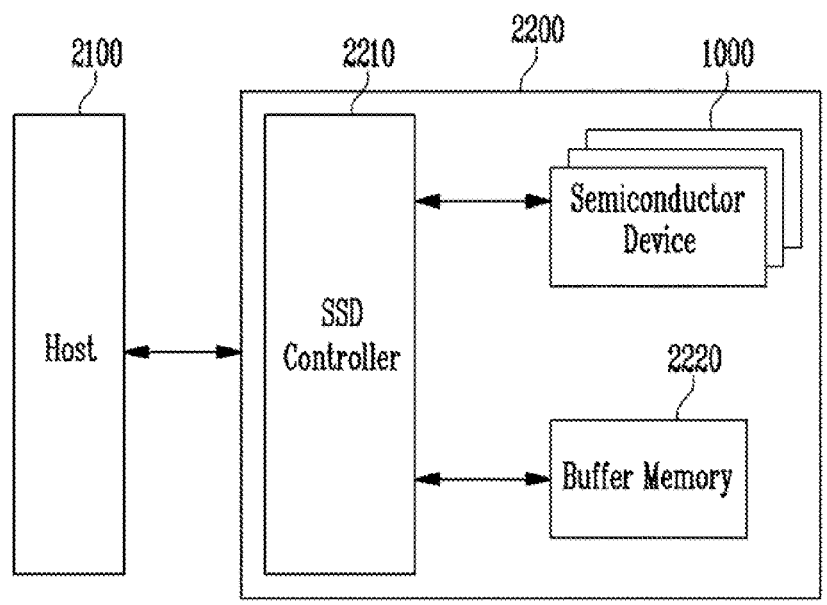
FIG. 7 is a block diagram illustrating a solid state drive including a semiconductor device according to an embodiment.

FIG. 7 is a block diagram illustrating a solid-state drive system including a semiconductor device according to an embodiment.

Referring to FIG. 7, a solid state drive (SSD) system 2000 may include a host 2100 and a solid-state drive (SSD) 2200. The SSD 2200 may include an SSD controller 2210, a buffer memory 2220 and a plurality of semiconductor memory devices 1000.

The SSD controller 2210 may provide a physical connection between the host 2100 and the SSD 2200. In other words, the SSD controller 2210 may perform Interfacing with the SSD 2200 according to a bus format of the host 2100. The SSD controller 2210 may decode a command provided from the host 2100. According to the decoding result, the SSD controller 2210 may access the semiconductor devices 1000. As the bus format of the host 2100, universal serial bus (USB), small computer system interface (SCSI), peripheral component interconnect express (PCI-E), advanced technology attachment (ATA), parallel ATA (PATA), serial ATA (SATA), and serial attached SCSI (SAS) may be included.

The buffer memory 2220 may temporarily store program data provided from the host 2100 or data read from the semiconductor devices 1000. When a read request is made by the host 2100, if data read from the semiconductor devices 1000 is cached, the buffer memory 2220 may support a cache function to directly provide the cached data to the host 2100. In general, the data transfer speed of the bus format (for example, SATA or SAS) of the host 2100 may be higher than the transfer speed of a memory channel of the SSD 2200. In other words, when an interface speed of the host 2100 is higher than the transfer speed of the memory channel of the SSD 2200, performance degradation caused by the speed difference may be minimized by providing a buffer memory 2220 having a large capacity. The buffer memory 2220 may be provided as synchronous DRAM to provide sufficient buffering in the SSD 2200.

The semiconductor devices 1000 may be provided as a storage medium of the SSD 2200. For example, each of the semiconductor devices 1000 may be provided as a nonvolatile memory device having large storage capacity. Each of the semiconductor devices 1000 may be provided as a NAND-type flash memory.

Figure 8:
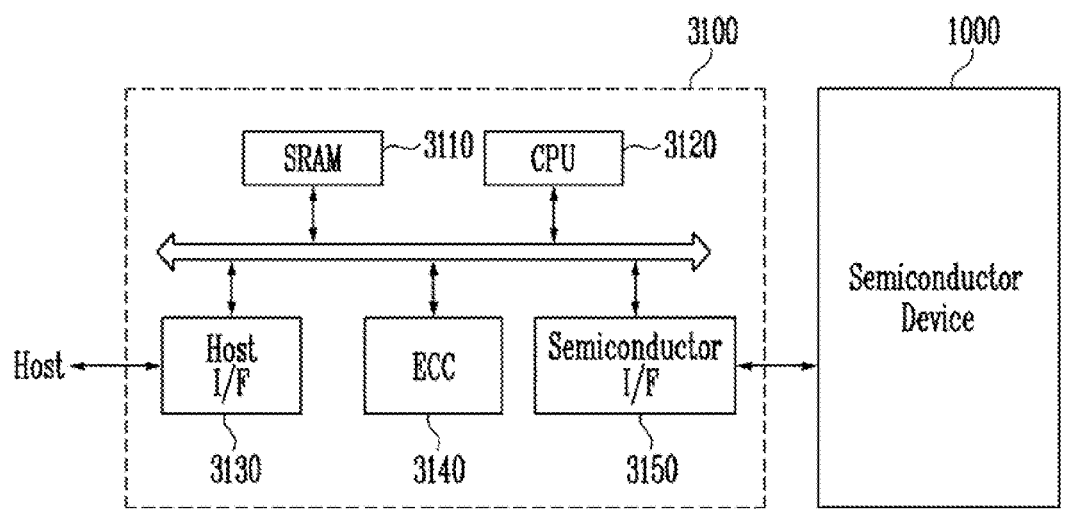
FIG. 8 is a block diagram illustrating a memory system including a semiconductor device according to an embodiment.

FIG. 8 is a block diagram illustrating a memory system 3000 according to an embodiment of the present invention.

Referring to FIG. 8, the memory system 3000 may include a memory control unit 3100 and the semiconductor device 1000.

The semiconductor device 1000 may be configured in substantially the same manner as described with reference to FIG. 1. Therefore, a detailed description of the semiconductor device 1000 may be omitted.

The memory control unit 3100 may control the semiconductor device 1000. The memory control unit 3100 may include a static random access memory (SRAM) 3110, a central process unit (CPU) 3120, a host interface (I/F) 3130, an error correction circuit (ECC) 3140, and a semiconductor I/F 3150. The SRAM 3110 may be used as a working memory of the CPU 3120. The host interface (I/F) 3130 may include a data exchange protocol of a host electrically coupled with the memory system 3000. The error correction circuit (ECC) 3140 may detect and correct errors in data read from the semiconductor device 1000. The semiconductor I/F 3150 may interface with the semiconductor device 1000. The CPU 3120 may perform a control operation for data exchange of the memory control unit 3100. In addition, although not illustrated in FIG. 5, a read only memory (ROM) (not shown) for storing code data for interfacing with a host may be provided in the memory system 3000.

The memory system 3000 may be applied to one of a computer, an ultra mobile PC (UMPC), a workstation, a netbook, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 9:
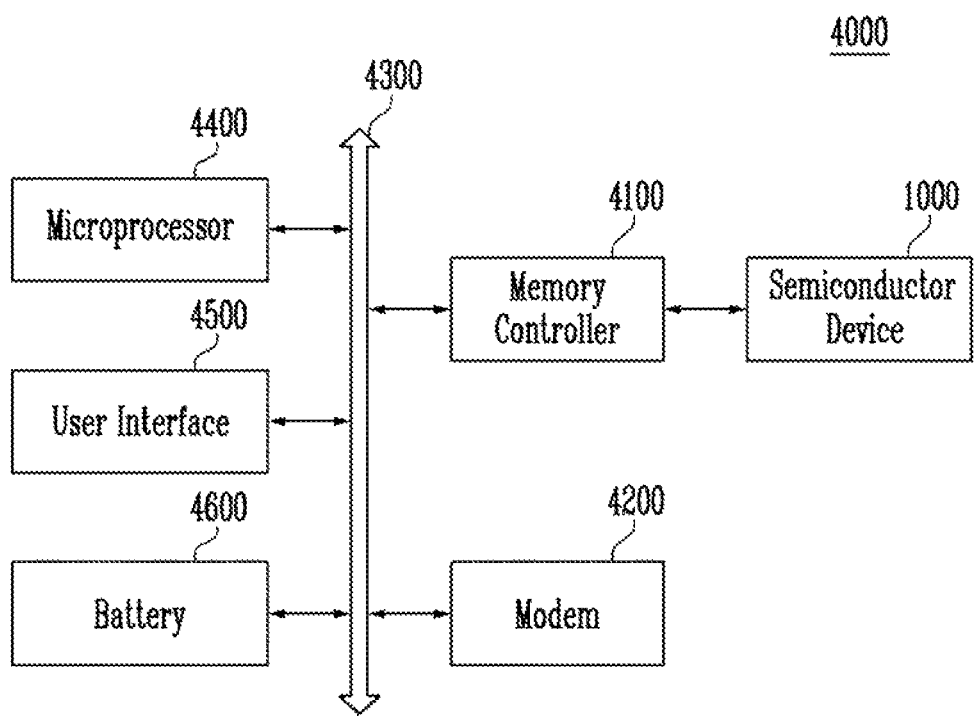
FIG. 9 is a diagram illustrating the schematic configuration of a computing system including a semiconductor device according to an embodiment.

FIG. 9 is a block diagram illustrating a computing system 4000 according to an embodiment of the present invention.

Referring to FIG. 9, the computing system 4000 may include the semiconductor device 1000, a memory controller 4100, a modem 4200, a microprocessor 4400, and a user interface 4500 which are electrically coupled to a bus 4300. When the computing system 4000 is a mobile device, a battery 4600 for supplying an operation voltage of the computing system 4000 may be additionally provided. The computing system 4000 may include an application chip set (not shown), a camera image processor (not shown), a mobile DRAM (not shown), and the like.

The semiconductor device 1000 may be configured in substantially the same manner as described with reference to FIG. 1.

The memory controller 4100 and the semiconductor device 1000 may be components of an SSD.

The semiconductor device 1000 and the memory controller 4100 may be mounted using various types of packages. For example, the semiconductor device 1000 and the memory controller 4100 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), and the like.

According to an embodiment, during a program operation, by preventing a channel voltage of unselected cell strings, unselected memory cells may be prevented from being programmed, so that reliability of a semiconductor device may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
    cell strings including a plurality of memory cells coupled between bit lines and a source line, and coupled to word lines;
    a peripheral circuit suitable for programming selected memory cells coupled to a selected word line among the word lines by applying a program voltage to the selected word line and applying one or more pass voltages to unselected word lines; and
    a control circuit suitable for controlling the peripheral circuit to temporarily float the unselected word lines while the selected memory cells are programmed.

2. The semiconductor device of claim 1, wherein the peripheral circuit comprises:
    a voltage generator suitable for generating the program voltage and the pass voltages, and temporarily floating lines to which the pass voltages is applied;
    a row decoder suitable for transferring one or more of the program voltage and the pass voltages to the word lines;
    a column decoder suitable for applying a program permission voltage to the selected bit lines, and applying a program inhibition voltage to the unselected bit lines; and
    an input/output circuit suitable for exchanging data with the column decoder and an external device.

3. The semiconductor device of claim 1,
    wherein, during the programming of the peripheral circuit, the control circuit controls the peripheral circuit to apply a program permission voltage to selected bit lines, apply a program inhibition voltage to unselected bit lines, apply the pass voltages to the selected word line and the unselected word lines, and apply the program voltage to the selected word line, and
    wherein the control circuit controls the peripheral circuit to temporarily float the unselected word lines to which the pass voltages are applied while the program voltage is applied to the selected word line.

4. The semiconductor device of claim 3, wherein the control circuit controls the peripheral circuit to temporarily float the unselected word lines once or more while the pass voltages are applied to the unselected word lines and the program voltage is applied to the selected word line.

5. The semiconductor device of claim 4,
    wherein the pass voltages are different from each other, and
    wherein voltage levels of the pass voltages are higher than a voltage level of a previous pass voltage and lower than a voltage level of the program voltage.

6. The semiconductor device of claim 4,
    wherein the pass voltages are the same as each other, and
    wherein voltage levels of the pass voltages are higher than a voltage level of a previous pass voltage and lower than a voltage level of the program voltage.

7. A method of operating a semiconductor device, the method comprising:
    performing a program operation on selected memory cells; and
    temporarily floating unselected word lines coupled to unselected memory cells while the program operation is performed.

8. The method of claim 7, wherein the program operation is performed by using an incremental step pulse program (ISPP) method or by applying a program voltage to a selected word line once.

9. The method of claim 7, wherein a program voltage is applied to a word line coupled to the selected memory cells, and a pass voltage is applied to the unselected word lines while the program operation is performed.

10. The method of claim 7, wherein the temporarily floating of the unselected word lines is performed once or more.

11. The method of claim 7, further comprising applying a pass voltage to the unselected word lines after the unselected word lines are temporarily floated.

12. A method of operating a semiconductor device, the method comprising:
    applying a program permission voltage to selected bit lines, and applying a program inhibition voltage to unselected bit lines;
    applying a first pass voltage to a selected word line and unselected word lines;
    applying a program voltage to the selected word line after the first pass voltage is applied for a predetermined period of time; and
    temporarily floating the unselected word lines to which the first pass voltage is applied while the program voltage is applied to the selected word line.

13. The method of claim 12,
    wherein the program permission voltage is a ground voltage,
    wherein the program inhibition voltage is a power voltage, and
    wherein the first pass voltage is lower than the program voltage.

14. The method of claim 12, further comprising applying the first pass voltage to the unselected word lines again after temporarily floating the unselected word lines.

15. The method of claim 12, further comprising applying a second pass voltage higher than the first pass voltage and lower than the program voltage to the unselected word lines after the unselected word lines are floated.

16. The method of claim 12, wherein the temporarily floating of the unselected word lines is performed once or more.

\* \* \* \* \*